(12) United States Patent
Kim

(10) Patent No.: US 7,763,539 B2
(45) Date of Patent: Jul. 27, 2010

(54) METHOD FOR MANUFACTURING SEMICONDUCTOR DEVICE

(75) Inventor: Seung Hyun Kim, Suwon-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 83 days.

(21) Appl. No.: 12/262,915

(22) Filed: Oct. 31, 2008

(65) Prior Publication Data

US 2009/0142922 A1 Jun. 4, 2009

(30) Foreign Application Priority Data

Dec. 3, 2007 (KR) .................. 10-2007-0124508

(51) Int. Cl.
*H01L 21/4763* (2006.01)
*H01L 21/44* (2006.01)

(52) U.S. Cl. .............. 438/643; 438/642; 438/631; 438/634; 438/637; 438/638; 438/653; 438/622

(58) Field of Classification Search ............ 438/622, 438/631, 634, 637–643, 652, 653
See application file for complete search history.

(56) References Cited

U.S. PATENT DOCUMENTS 6,352,920 B1 * 3/2002 Shimomura ............ 438/637

2004/0002212 A1 * 1/2004 Choi ..................... 438/687
2005/0029010 A1 * 2/2005 Ahn et al. .............. 174/255
2005/0140012 A1 * 6/2005 Jung ...................... 257/762

FOREIGN PATENT DOCUMENTS

| KR | 1020050007004 | 1/2005 |
| KR | 1020060018633 | 3/2006 |
| KR | 1020060075748 | 7/2006 |
| KR | 1020070066298 | 6/2007 |

* cited by examiner

*Primary Examiner*—Ha Tran T Nguyen
*Assistant Examiner*—Karen M Kusumakar
(74) *Attorney, Agent, or Firm*—Workman Nydegger

(57) ABSTRACT

A method for manufacturing a semiconductor device. In one example embodiment, a method for manufacturing a semiconductor device includes various steps. First, a dielectric layer is formed on the whole surface of a semiconductor substrate that includes an upper surface of a transistor. Next, a trench and a contact hole are formed by etching the dielectric layer so that the upper surface of the transistor is exposed. Then, a contact is formed by embedding a first conductive layer in the contact hole. Next, an etching stop layer is selectively forming on an upper part of the contact. Then, the semiconductor device is blanket-etched such that the first conductive layer remains in the trench. Next, the etching stop layer is removed. Finally, a metal line is formed by embedding a second conductive layer in the trench.

15 Claims, 4 Drawing Sheets

METHOD FOR MANUFACTURING SEMICONDUCTOR DEVICE

CROSS-REFERENCE TO A RELATED APPLICATION

This application claims the benefit of Korean Patent Application No. 10-2007-0124508, filed on Dec. 3, 2007 which is hereby incorporated by reference as if fully set forth herein.

BACKGROUND

1. Field of the Invention

Embodiments of the present invention relate to methods for manufacturing a semiconductor device, and more particularly, to methods for manufacturing a semiconductor device in which a metal line and a contact are formed.

2. Description of the Related Art

A copper line can be used to improve an operational speed of a semiconductor device. A copper line is usually manufactured by a damascene process due to difficulty in etching. Damascene processes include dual-damascene processes and single-damascene processes. In dual-damascene processes, an etching stop layer and an interlayer dielectric are deposited in multiple layers and etched, thereby forming via holes and trenches. Next, a diffusion stop layer and a seed layer are formed at the upper part of the whole structure including the via holes and the trenches. A copper line is vapor-deposited through electroplating, and the copper is polished by chemical mechanical polishing (CMP) such that a via plug and the copper line are formed simultaneously.

However, since copper atoms may diffuse to a lower transistor and thereby cause contamination when embedding the copper in the contact holes, a single-damascene process may be used. In a single-damascene process, tungsten is embedded in the contact holes and the copper line is formed at only the upper part of the tungsten. When using a single-damascene process, however, misalignment may be generated between the contact holes embedded with tungsten and the upper copper line. Furthermore, when the trenches are etched to form the upper copper line, defects may be caused due to variations in processing capability. These defects include an opening between the copper line and the contact hole or a void of the copper line.

SUMMARY OF EXAMPLE EMBODIMENTS

In general, example embodiments of the present invention relate to methods for manufacturing a semiconductor device. Some example embodiments of the present invention provide a method for manufacturing a semiconductor device that is capable of preventing a misalignment between a contact and a metal line. Some example embodiments are also capable of preventing an opening between the contact and the metal line or a void of the metal line by using a dual-damascene process.

In one example embodiment, a method for manufacturing a semiconductor device includes various steps. First, a dielectric layer is formed on the whole surface of a semiconductor substrate that includes an upper surface of a transistor. Next, a trench and a contact hole are formed by etching the dielectric layer so that the upper surface of the transistor is exposed. Then, a contact is formed by embedding a first conductive layer in the contact hole. Next, an etching stop layer is selectively forming on an upper part of the contact. Then, the semiconductor device is blanket-etched such that the first conductive layer remains in the trench. Next, the etching stop layer is removed. Finally, a metal line is formed by embedding a second conductive layer in the trench.

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter. Moreover, it is to be understood that both the foregoing general description and the following detailed description of the present invention are exemplary and explanatory and are intended to provide further explanation of the invention as claimed.

BRIEF DESCRIPTION OF THE DRAWINGS

Aspects of example embodiments of the present invention will become apparent from the following detailed description of example embodiments given in conjunction with the accompanying drawings, in which.

DETAILED DESCRIPTION OF EXAMPLE EMBODIMENTS

In general, example embodiments of the present invention relate to methods for manufacturing a semiconductor device. In the following detailed description of the embodiments, reference will now be made in detail to specific embodiments of the present invention, examples of which are illustrated in the accompanying drawings. Wherever possible, the same reference numbers will be used throughout the drawings to refer to the same or like parts. These embodiments are described in sufficient detail to enable those skilled in the art to practice the invention. Other embodiments may be utilized and structural, logical and electrical changes may be made without departing from the scope of the present invention. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of the present invention is defined only by the appended claims, along with the full scope of equivalents to which such claims are entitled.

FIG. 1A through FIG. 1J are sectional views illustrating an example method for a semiconductor device according to an embodiment of the present invention.

Figure 1A:
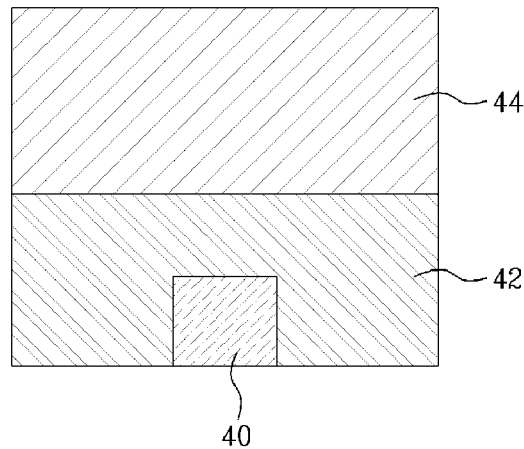
FIG. 1A through FIG. 1J are sectional views illustrating an example method for manufacturing a semiconductor device.

As disclosed in FIG. 1A, a dielectric film, that includes first and second dielectric layers 42 and 44, is formed on the whole surface of a semiconductor substrate (not shown). The semiconductor substrate includes an upper surface of a transistor, such as a gate 40 for example. In addition to the gate 40, the transistor may also include a source (not shown) and a drain (not shown). Therefore, although only the gate 40 is shown in FIG. 1A, a source and a drain may be further formed on both sides of the gate 40 in the semiconductor substrate. In addition, a spacer (not shown) may be formed on both sides of the gate 40, and a silicide (not shown) may be formed on an upper part of the gate 40. Also, although not shown, it is understood that the semiconductor substrate may be disposed at a lower part of the gate 40.

As disclosed in FIG. 1A, the dielectric film may include one or more dielectric layers. For example, the embodiment of the dielectric film disclosed in FIG. 1A includes both the first dielectric layer 42 and the second dielectric layer 44. First, the first dielectric layer 42 is formed on the whole surface of the semiconductor substrate (not shown) that includes the upper surface of the gate 40. Next, the second dielectric layer 44 is formed on the whole upper surface of the first dielectric layer 42. It is understood that in some example embodiments, may include only a single dielectric layer or more than two dielectric layers.

As will be described hereinafter, in order to prevent diffusion of copper toward the transistor when a copper line 56A (see FIG. 1I) is formed, the first dielectric layer 42 may be formed of materials for effectively preventing diffusion of copper, such as, but not limited to, boron silicate glass (BSG), phosphor silicate glass (PSG), boron phosphor silicate glass (BPSG), or some combination thereof. The second dielectric layer 44 may be formed, for example, of undoped silicate glass (USG), fluorine silicate glass (FSG), or some combination thereof.

Figure 1B:
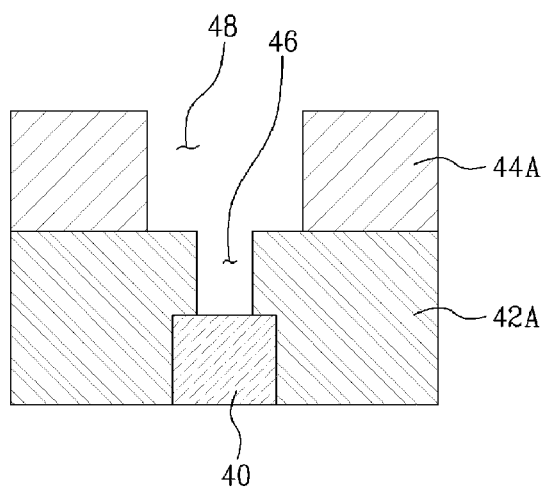

As disclosed in FIG. 1B, the dielectric layers 42 and 44 are next etched to expose the upper surface of the gate 40 of the transistor, thereby forming a trench 48 and a contact hole 46. For example, more specifically, a photoconductive layer (not shown) is applied on the upper part of the second dielectric layer 44 and then patterned and exposed, such that the trench 48 is formed. Next, another photoconductive layer (not shown) is applied on the first dielectric layer 42 and the exposed second dielectric layers 44A, and then patterned and exposed, thereby forming the contact hole 46. The trench and the contact hole may have a single-damascene structure or a dual-damascene structure. For example, the first contact hole 46 may be formed in the exposed first dielectric layer 42A whereas the trench 48 is formed in the exposed second dielectric layer 44A.

Figure 1C:
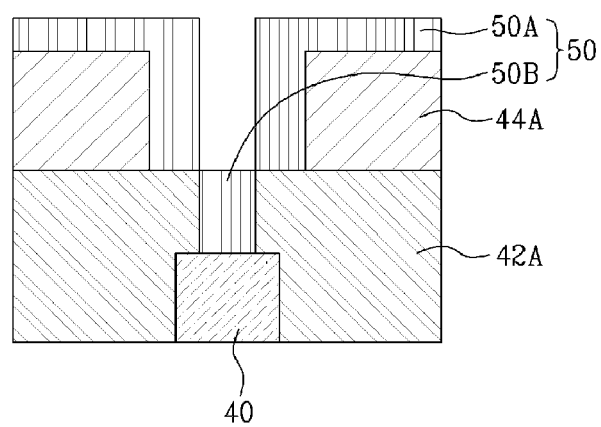

As disclosed in FIG. 1C, a first conductive layer 50 is next formed. The first conductive layer 50 may formed from tungsten, for example. The first conductive layer 50 includes a contact 50A and a contact 50B. The contact 50B is formed by embedding a portion of the first conductive layer 50 in the contact hole 46. The contact 50A is formed from a portion of the first conductive layer 50 on the upper part of the exposed first dielectric layer 42A, on the sidewalls of the trench 48, and on the upper surface of the exposed second dielectric layer 44A.

Figure 1D:
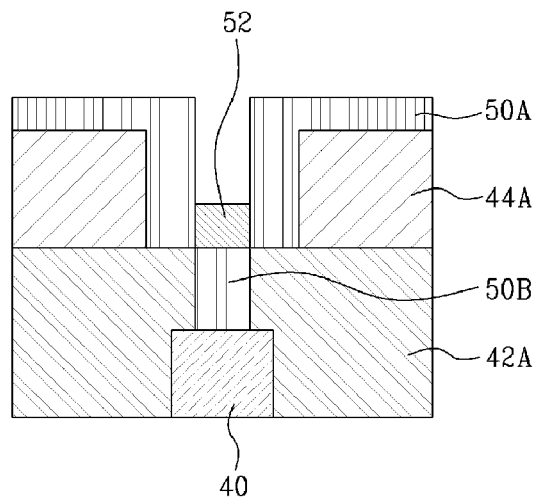
Figure 1E:
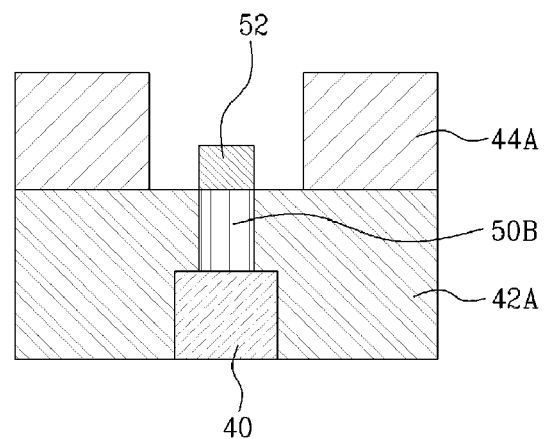
Figure 1F:
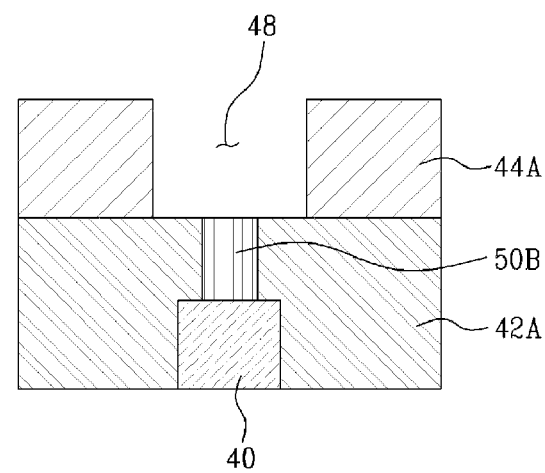
Figure 1G:
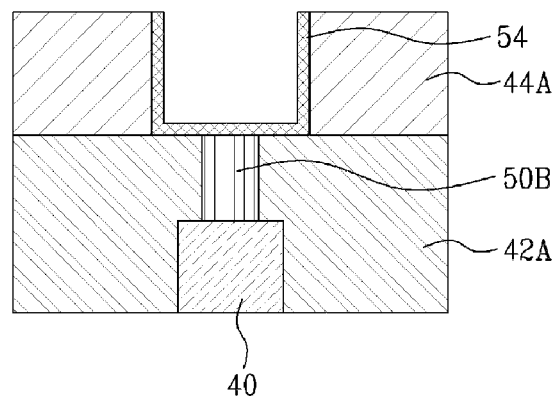
Figure 1H:
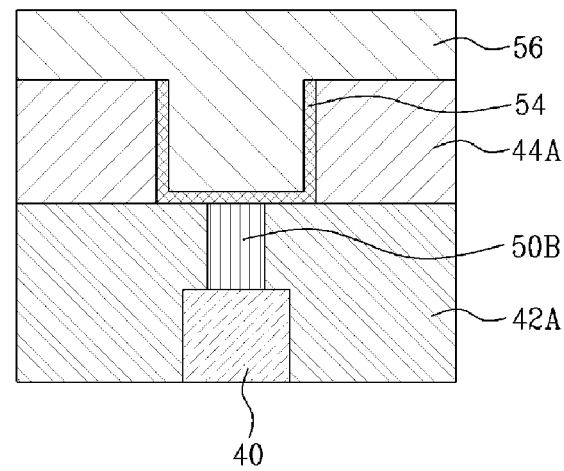
Figure 1I:
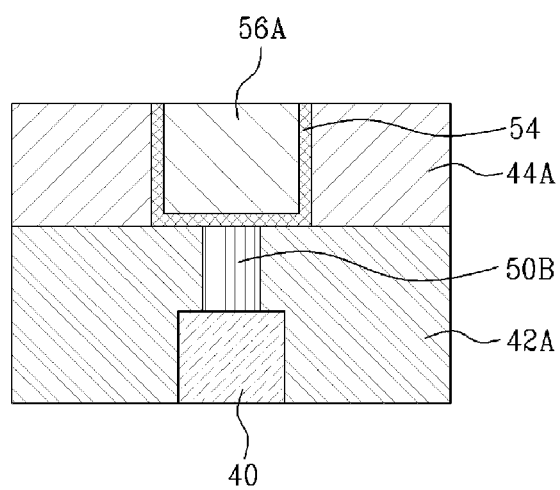
Figure 1J:
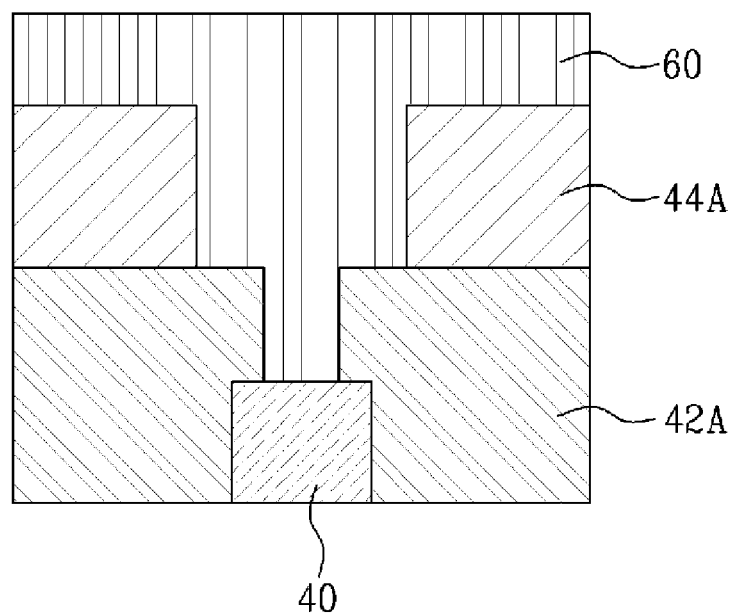

In an alternative embodiment disclosed in FIG. 1J, a first conductive layer 60 is instead vapor-deposited in order to fill the contact hole 46 and the trench 48, Next, as disclosed in FIG. 1C, a photoconductive layer (not shown) is applied on the first conductive layer 60 and patterned and exposed, thereby etching the first conductive layer 60 such that the contact 50B remains in the contact hole 46 and the contact 50A remains on the upper part of the exposed first dielectric layer 42A, on the sidewalls of the trench 48, and on the upper surface of the exposed second dielectric layer 44A.

As disclosed in FIG. 1D, after the first conductive layer 50 is formed, an etching stop layer 52 is next selectively formed on the contact 50B. The etching stop layer 52 may be formed from photoresist, an oxide, or a nitride, for example. As disclosed in FIG. 1E, blanket etching is next performed in order to remove the contact 50A. The etching stop layer 52 is formed to have thickness capable of protecting the contact 50B from etching while the contact 50A is being removed by blanket etching.

As disclosed in FIG. 1F, the etching stop layer 52 is next removed by ashing. As disclosed in FIG. 1G, a diffusion stop layer 54 is next formed on an inner wall of the trench 48 and the upper surface of the contact 50B. The diffusion stop layer 54 may be formed through physical vapor deposition (PVD) or atomic layer deposition (ALD), for example. Where a metal line 56A (see FIG. 1I) is formed from copper, the diffusion stop layer 54 prevents the copper from diffusing toward the transistor, and furthermore, reinforces adhesion between the copper and the second dielectric layer 44A. The diffusion stop layer 54 may be formed of TaN, TiN, Ta, TaSiN, TiN, TiSiN, or some combination thereof.

As disclosed in FIG. 1H, a second conductive layer 56 is next embedded in the trench 48. The second conductive layer may be formed from copper by PVD, CVD or electroplating, for example. Where the second conductive layer 56 is formed by electroplating, a seed copper layer is vapor-deposited on the whole surface of the diffusion stop layer 54 through PVD or CVD and the resultant structure is immersed in electrolyte, thereby forming the second conductive layer 56 as disclosed in FIG. 1H.

As disclosed in FIG. 1I, the metal line 56A is formed by planarizing the second conductive layer 56, using CMP for example.

The example methods for manufacturing the semiconductor device disclosed herein include a tungsten contact and a copper line that are formed by a dual-damascene process. Therefore, misalignment between the tungsten contact and the copper line, that may be generated in a single-damascene process, can be prevented. In addition, an opening between the copper line and the contact or a void of the copper line, which may be generated when etching trenches using a single-damascene process, can be prevented.

Although example embodiments of the present invention have been shown and described, various modifications and variations might be made to these example embodiments. The scope of the invention is therefore defined in the following claims and their equivalents.

What is claimed is:

1. A method for manufacturing a semiconductor device, comprising:
    forming a dielectric layer on the whole surface of a semiconductor substrate that includes an upper surface of a transistor;
    forming a trench and a contact hole by etching the dielectric layer so that the upper surface of the transistor is exposed;
    forming a contact by embedding a first conductive layer in the contact hole;
    selectively forming an etching stop layer on an upper part of the contact;
    blanket-etching the semiconductor device such that the first conductive layer remains in the trench;
    following the blanket-etching, removing the etching stop layer; and
    after removal of the etching stop layer, forming a metal line by embedding a second conductive layer in the trench.

2. The method according to claim 1, wherein forming a dielectric layer comprises:
    forming a first dielectric layer on the whole surface of the semiconductor substrate that includes the upper surface of the transistor; and
    forming a second dielectric layer on the whole surface of the first dielectric layer.

3. The method according to claim 2, wherein the first dielectric layer comprises BSG, PSG, BPSG, or some combination thereof.

4. The method according to claim 2, wherein the second dielectric layer comprises USG, FSG, or some combination thereof.

5. The method according to claim 2, wherein the trench and the contact hole are formed in the dielectric layer in a damascene structure.

6. The method according to claim 5, wherein the contact hole is formed in the first dielectric layer whereas the trench is formed in the second dielectric layer.

7. The method according to claim 6, wherein the first conductive layer fills the contact hole, and is further formed on an exposed upper part of the first dielectric layer, on the sidewalls of the trench, and on an exposed upper surface of the exposed second dielectric layer.

8. The method according to claim 1, further comprising forming a diffusion stop layer on an upper surface of the contact and an inner wall of the trench, after removing the etching stop layer.

9. The method according to claim 8, further comprising forming a second contact in the trench after the formation of the diffusion stop layer.

10. The method according to claim 1, wherein the first conductive layer comprises tungsten and the second conductive layer comprises copper.

11. The method according to claim 1, wherein the etching stop layer comprises photoresist.

12. The method according to claim 1, wherein the etching stop layer comprises an oxide or a nitride.

13. The method according to claim 1, wherein forming a contact comprises:

vapor-depositing the first conductive layer in the contact hole and on the whole surface of the trench.

14. The method according to claim 1, wherein forming a contact comprises:

vapor-depositing the first conductive layer to fill in the contact hole and the trench; and patterning and etching the first conductive layer such that an upper surface of the contact formed in the contact hole is exposed.

15. The method according to claim 1, wherein an upper surface of the transistor includes a gate.

* * * * *